United States Patent [19]
Tran

[11] Patent Number: 6,008,116
[45] Date of Patent: Dec. 28, 1999

[54] SELECTIVE ETCHING FOR IMPROVED DIELECTRIC INTERLAYER PLANARIZATION

[75] Inventor: Khanh Tran, San Jose, Calif.

[73] Assignee: Advanced Micro Devices, Inc., Sunnyvale, Calif.

[21] Appl. No.: 08/993,120

[22] Filed: Dec. 18, 1997

[51] Int. Cl.[6] .................................................. H01L 21/469
[52] U.S. Cl. .......................... 438/623; 438/625; 438/624; 438/633
[58] Field of Search ..................... 438/622, 625, 438/624, 623, 633

[56] References Cited

U.S. PATENT DOCUMENTS 5,663,108  9/1997  Lin ........................................... 438/624
5,888,898  3/1999  Ngo et al. ................................ 438/622

*Primary Examiner*—Chandra Chaudhari
*Assistant Examiner*—Lisa Kilday

[57] ABSTRACT

Planarization of a dielectric interlayer containing a dielectric gap filled layer is improved and facilitated by selective etching to reduce or eliminate steps in the gap filled dielectric layer before oxide deposition and polishing. Embodiments include gap filling a patterned metal layer with SOG or HSQ, forming a photoresist mask with an opening over steps having a height greater than about 3,000 Å, etching to reduce the height of the step by at least 70% depositing silicon oxide derived from TEOS or silane by PECVD and CMP.

15 Claims, 2 Drawing Sheets

SELECTIVE ETCHING FOR IMPROVED DIELECTRIC INTERLAYER PLANARIZATION

TECHNICAL FIELD

The present invention relates to a method of manufacturing a semiconductor device comprising dielectric layers having improved planarity. The present invention has particular applicability in manufacturing high density, multi-metal layer semiconductor devices with design features of 0.25 microns and under.

BACKGROUND ART

The escalating demands for high densification and performance associated with ultra large scale integration semiconductor devices require design features of 0.25 microns and under, such as about 0.18 microns, increased transistor and circuit speeds, high reliability and increased production throughput for economic competitiveness. The reduction of design features to 0.25 microns and under challenges the limitations of conventional methodology, particularly conventional photolithographic and polishing techniques.

Conventional methodology for forming patterned metal layers comprises a subtractive etching or etch back step as the primary metal patterning technique. Such a method involves the formation of a first dielectric layer on a semiconductor substrate, typically appropriately doped monocrystalline silicon, with conductive contacts formed therein for electrical connection with an active region on the semiconductor substrate, such as a source/drain region. A metal layer is deposited on the first dielectric layer. The metal layer is typically a composite comprising a first metal layer such as tungsten or titanium, a second intermediate primary metal layer such as aluminum or an aluminum alloy, and an upper anti-reflective coating which also serves as an etch stop layer such as titanium nitride. A photoresist mask is formed on the metal layer having a pattern defining a plurality of conductive features in accordance with design requirements. The metal layer is then etched through the photoresist mask to form the conductive pattern comprising metal features separated by gaps, such as a plurality of metal lines with interwiring spacings therebetween. A dielectric layer, such as spin on glass (SOG) is then applied to the resulting conductive pattern to fill the gaps. Another dielectric layer is then deposited, such as silicon oxide derived from tetraethyl orthosilicate (TEOS) or silane by plasma enhanced chemical vapor deposition (PECVD). Planarization is then effected, as by etching or chemical mechanical polishing (CMP).

The conductive pattern typically comprises a plurality of metal features, some of which have different sizes. For example, a typical conductive pattern comprises a dense array of metal features, typically separated by gaps having a width of less than about 1 micron, e.g., about 0.375 microns for metal features of about 0.25 microns. A metal feature neighboring a leading or trailing metal feature of a dense array, however, may be considerably larger than the metal features of the dense array. For example, neighboring metal features may have an upper surface area greater than the upper surface area of a leading or trailing metal feature of a dense array such that, upon depositing a gap filling dielectric layer, a step is formed with increasing height between the relatively smaller leading or trailing metal feature and the relatively larger neighboring metal feature. Such steps can have a height in excess 3,000 Å and may be as high as 1 micron or greater. It is extremely difficult to planarize an oxide layer deposited on such steps.

Moreover, as feature sizes shrink to 0.25 microns and under, planarization becomes even more critical in that irregular topography may exceed the depth of focus limitations of conventional photolithographic techniques. Accordingly, as design features shrink to 0.25 microns, it becomes increasing critical to minimize or reduce the formation of steps when gap filling patterned conductive layers.

There exists a need for semiconductor methodology for improved planarization of dielectric layers. There exists an even greater need for improved planarization of dielectric layers in manufacturing semiconductor devices having a feature size of about 0.25 microns or under.

DISCLOSURE OF THE INVENTION

An object of the present invention is a method of manufacturing a high density semiconductor device having dielectric interlayers with improved planarity.

Another object of the present invention is a method of manufacturing a high density semiconductor device with design feature of 0.25 microns and under having dielectric interlayers with improved planarity.

Additional objects, advantages and other features of the present invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device, which method comprises: forming a first dielectric layer, comprising a first dielectric material, on a substrate; forming a patterned conductive layer comprising gaps and a plurality of conductive features including first and second conductive features spaced apart by a gap; depositing a second dielectric layer, comprising a second dielectric material, on the patterned conductive layer filling the gaps and forming a step increasing in height between the first and second conductive features; and selectively etching to remove a portion of the second dielectric material from an upper surface of the second metal feature to reduce the height of the step.

Another aspect of the present invention is a semiconductor device, comprising: a substrate; a first dielectric layer, comprising a first dielectric material, formed on the substrate; a patterned metal layer formed on the first dielectric layer, the patterned metal layer having gaps and containing a plurality of metal features including first and second metal features spaced apart by a gap, the first and second metal features comprising an upper surface and side surfaces; and a second dielectric layer, comprising a second dielectric material, on the patterned metal layer filling the gaps; wherein, the second dielectric material covers the side surfaces and a minor portion of the upper surface of the second metal feature and the second dielectric material has a thickness over a major portion of the upper surface of the second metal feature less than one thickness on the upper surface of the first metal feature.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1:
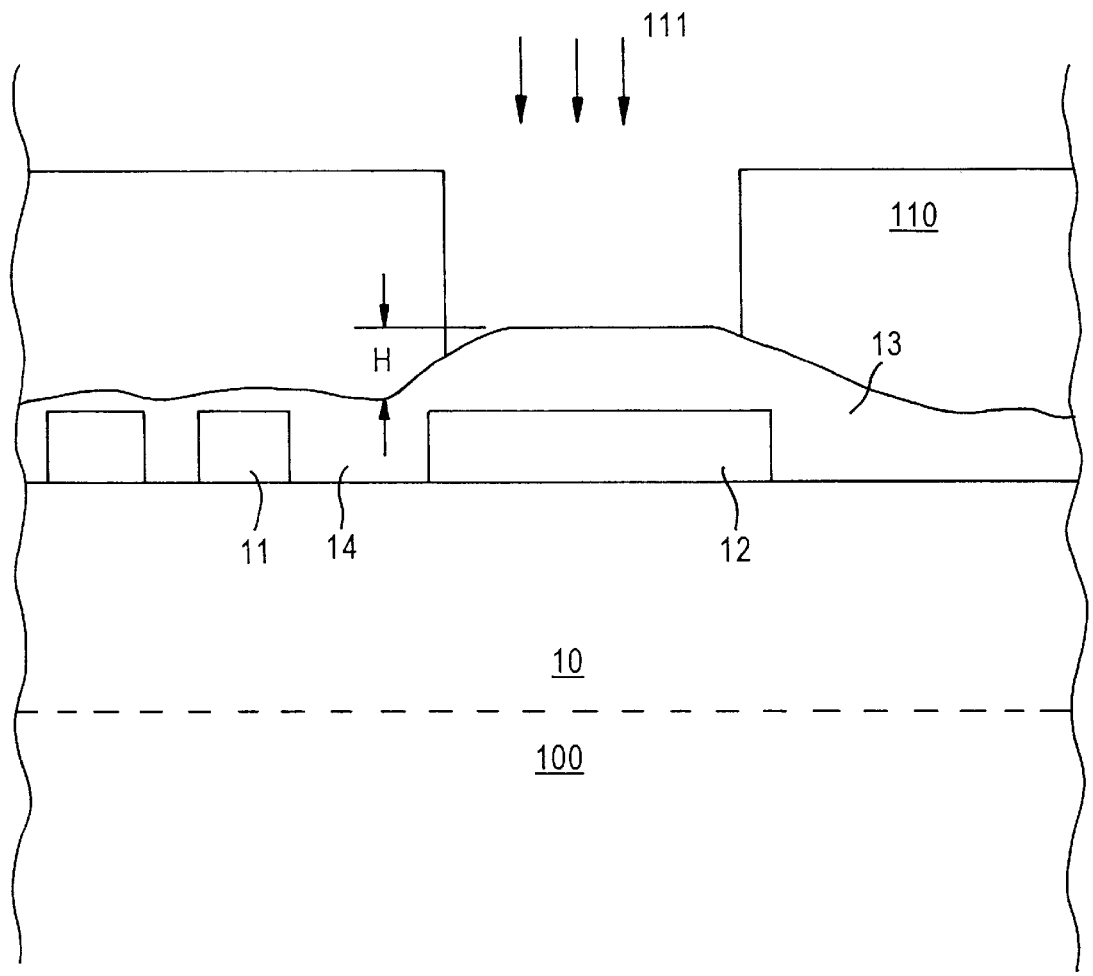
FIGS. 1 and 2 represent sequential stages in a method according to an embodiment of the present invention.

The present invention provides a simplified, cost effective technique for improving planarization of dielectric layers, thereby improving photolithographic accuracy and increasing production throughput. In accordance with embodiments of the present invention, a metal layer formed on a first dielectric layer is patterned to form a plurality of metal features separated by gaps of various distances. The patterned metal layer comprises first and second spaced apart metal features, wherein the upper surface area of the first metal feature is less than the upper surface area of the second metal feature such that, upon depositing a dielectric gap filling layer, a step is formed increasing in height between the first metal feature and the second metal feature. Such a step is due, in part, to the larger upper surface area of the second metal feature. As a result of the larger upper surface area of the second metal feature, the dielectric gap filling layer is deposited thereon at a thickness significantly greater than the thickness to which the dielectric gap filling material is deposited on the neighboring first metal feature having a lower upper surface area, thereby forming the step. Such a step can have a height of about 3,000 Å or more, thereby rendering it extremely difficult to planarize a subsequently deposited oxide layer. The present invention departs from conventional practices by reducing the height of the step formed in the dielectric gap filled layer between the first and second metal features, as by selective etching, prior to depositing the oxide layer and planarizing.

In accordance with embodiments of the present invention, a simplified photoresist mask is formed on the deposited gap filled dielectric layer. The photoresist mask is provided with openings strategically positioned over metal features having a relatively large upper surface area. As the openings are formed in the mask only over metal features having relatively large surface areas, the photoresist mask can be formed employing a relatively simple algorithm.

After formation of the photoresist mask on the dielectric gap filled layer, etching is conducted to remove the gap filling dielectric material from the upper surface of metal features having relatively large upper surface areas, thereby reducing the height of any steps formed between such metal features and neighboring metal features. Embodiments of the present invention include reducing the height of steps having a height of about 3,000 Å or more by at least 70%. Other embodiments of the present invention comprise removing substantially all of the dielectric gap filling material from a substantial portion of the upper surface of metal features having a large upper surface area, e.g., removing substantially all of the dielectric gap filling material from a major portion of the upper surface.

It should be understood that the photoresist mask employed in accordance with embodiments of the present invention is provided with an opening over one or more metal features having a relative large upper surface area (second metal feature) neighboring a metal feature having a smaller upper surface area wherein a step having a height negatively impacting planarization is formed therebetween. Such relatively large metal features generally have an upper surface area of no less than about 100 microns$^2$, which is significantly greater than the upper surface area of the neighboring metal feature (first metal feature). In accordance with the present invention, etching is conducted in a conventional manner employing a conventional oxide etch, such as plasma etch using fluorocarbon chemistry. After reducing the height of the step or eliminating the step completely, another dielectric layer is applied, typically silicon oxide derived from TEOS or silane by PECVD. Planarization is then effected as by CMP.

The present invention provides simplified methodology facilitating and improving the planarization of a dielectric layer thereby improving the accuracy of photolithographic processing. The present invention has particular applicability in manufacturing semiconductor devices having design features of 0.25 microns and under, wherein the accuracy limitations of photolithographic techniques are strained. Thus, in accordance with the present invention, semiconductor devices having design features of 0.25 microns and under are formed with a greater reliability due to improved photolithographic accuracy stemming from improved planarization of dielectric interlayers.

In embodiments of the present invention, the metal layers comprises a conventional composite comprising a first metal layer of titanium or tungsten, a second intermediate or primary conductive layer of aluminum or an aluminum alloy and an upper anti-reflective coating/etch stop layer, such as titanium nitride. The gap filling dielectric material employed in the present invention can comprise spin on glass or a relatively low dielectric constant material, e.g., a dielectric constant of less than 4 with reference to 1 as the dielectric constant of air. Such low dielectric constant materials include hydrogen silsesquioxane (HSQ), which can be deposited by conventional spinning techniques, having an as-deposited dielectric constant of about 2.9–3.0. After etching to reduce the height of steps, typically steps in excess of 3,000 Å, another dielectric layer, such as silicon oxide derived from TEOS or silane by PECVD is deposited and planarized in a conventional manner by CMP.

Figure 2:
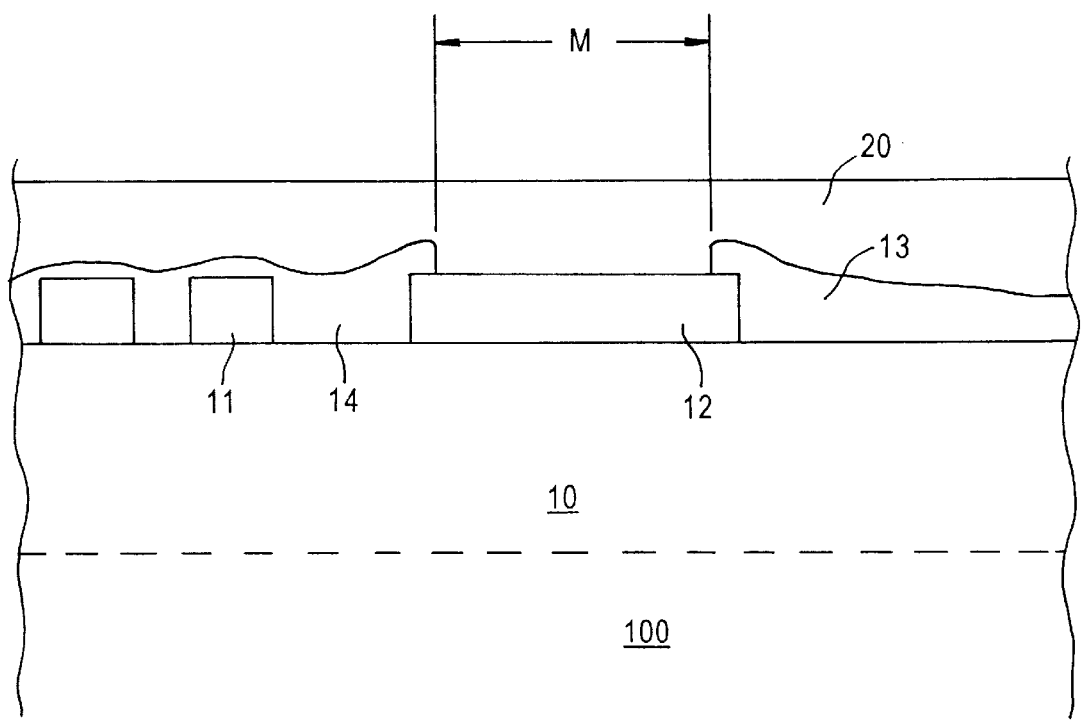

An embodiment of the present invention is illustrated in FIGS. 1 and 2, wherein similar features are denoted by similar reference numerals. Adverting to FIG. 1, a metal layer or composite metal layer is deposited on first dielectric layer 10. The patterned metal layer comprises a first metal feature 11 and a second metal feature 12 separated by gap 14. First metal feature 11 can comprise a leading metal feature of a dense array of conductive lines having a width of about 0.25 microns and an interwiring spacing of about 0.375 microns. A layer of dielectric gap filling material 13 is deposited, such as SOG or HSQ. The upper surface area of second metal feature 12 is considerably greater than the upper surface area of first metal feature 11, such that a step H with increasing height is formed between first metal feature 11 and second metal 12, due to the greater thickness of dielectric gap filling material 13 on the upper surface of second metal feature 12 vis-à-vis on the upper surface of first metal feature 11. Steps having a height of about 3,000 Å or greater can be formed, particularly in situations wherein the upper surface area of the second metal feature is no less than about 100 microns$^2$. Such steep steps render it very difficult to effectively planarize a dielectric layer deposited thereon, thereby straining limits of photolithographic accuracy, particularly in manufacturing semiconductor devices having design features of 0.25 microns and under.

In accordance with the present invention, a photoresist mask (110) is formed on gap filling dielectric layer 13 and provided with openings above metal features wherein dielectric gap filling material is deposited to such an extent that an appreciable step is formed between such metal features and adjoining metal features, such as above second metal feature 12. Etching is then conducted, as with a conventional oxide etching recipe, to remove gap filling dielectric material from a major portion of the upper surface of the second metal feature or features. Embodiments of the present invention comprise removing a sufficient amount of dielectric gap filling material from the upper surface of the second metal feature or features to reduce the height of step H by at least 70%. Embodiments of the present invention include removing substantially all of the dielectric gap filling material 13 from the major portion of the upper surface of second metal feature 12, thereby totalling eliminating the step.

Subsequent to etching, another dielectric layer 20 is deposited, as shown in FIG. 2. Dielectric layer 20 comprises a dielectric material different from that of dielectric gap filling layer 13, such as SOG or HSQ. Dielectric layer 20 is formed on dielectric gap filling layer 13 and on a major portion M of the upper surface of second metal feature 12. Planarization is then implemented to provide a substantially planar surface on dielectric interlayer 20, which planarization is facilitated and enhanced by the selective etching procedure in accordance with embodiments of the present invention.

Thus, in accordance with the present invention, planarization of dielectric interlayers is facilitated and improved, thereby increasing production throughput and improving dimensional accuracy. Improved planarization improves the accuracy of photolithographic processing, thereby enabling the manufacture of semiconductor devices having design features of 0.25 microns and under with improved accuracy and reliability.

The present invention is applicable to the production of various types of semiconductor devices, particularly multimetal layered semiconductor devices with submicron features, particularly of about 0.25 microns and under, exhibiting high speed characteristics with improved reliability. The present invention is cost effective and can easily be integrated into conventional processing equipment with an attendant increase in production throughput and device reliability.

In carrying out the embodiments of the present invention, the metal layers can be formed of any metal layers typically employed in the manufacture of semiconductor devices, such as aluminum, aluminum alloys, copper, copper alloys, gold, gold alloys, silver, silver alloys, refractory metals, refractory metal alloys, and refractory metal compounds. The metal layers of the present invention can be formed by any technique conventionally employed in the manufacture of semiconductor devices. For example, the metal layers can be formed by conventional metallization techniques, such as various types of chemical vapor deposition (CVD) processes, including low pressure chemical vapor deposition (LPCVD), and PECVD. Typically, when high melting metal point metals, such as tungsten, are deposited, CVD techniques are employed. Low melting point metals, such as aluminum and aluminum alloys, including aluminum-copper alloys, can be deposited by melting, sputtering, or other physical vapor deposition (PVD) techniques.

In the previous descriptions, numerous specific details are set forth, such as specific materials, structures, chemicals, processes and parameters, in order to provide a thorough understanding of the present invention. However, the present invention can be practiced without resorting to the details specifically set forth. In other instances, well known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, which method comprises:

forming a first dielectric layer, comprising a first dielectric material, on a substrate;

forming a patterned conductive layer comprising gaps and a plurality of conductive features including first and second conductive features spaced apart by a gap on the first dielectric layer;

depositing a second dielectric layer, comprising a second dielectric material, on the patterned conductive layer filling the gaps and forming a step increasing in height between the first and second conductive features; and selectively etching to remove a portion of the second dielectric material from an upper surface of the second conductive feature to reduce the height of the step, wherein the first conductive feature as an upper surface area less than an upper surface area of the second conductive feature.

2. The method according to claim 1, wherein the step has a height, before selective etching, greater than about 3,000 Å.

3. The method according to claim 2, comprising:

forming a photoresist mask on the deposited second dielectric layer; and etching through the photoresist mask to reduce the height of the step.

4. The method according to claim 3, comprising etching to reduce the height of the step by at least 70%.

5. The method according to claim 4, comprising etching to substantially eliminate the step.

6. The method according to claim 4, further comprising:

depositing a third dielectric layer, comprising a third dielectric material different from the second dielectric material, on the second dielectric layer; and planarizing the third dielectric layer by chemical mechanical polishing.

7. The method according to claim 6, wherein the third dielectric material comprises silicon oxide derived from tetraethyl orthosilicate or silane by plasma enhanced chemical vapor deposition.

8. The method according to claim 4, wherein the conductive features comprise metal features.

9. The method according to claim 1, wherein the upper surface area of the second metal feature is no less than about 100 microns$^2$.

10. The method according to claim 1, wherein the first metal feature has a width no greater than about 0.25 microns.

11. The method according to claim 10, wherein the first metal feature is a leading metal feature of a dense array of metal features and is spaced apart from the second metal feature by a distance of no less than about 10 microns.

12. The method according to claim 4, wherein the second dielectric material comprises spin on glass or hydrogen silsesquioxane (HSQ).

13. The method according to claim 12, wherein the second dielectric material is HSQ and is deposited by a spin on technique.

14. The method according to claim 4, comprising plasma etching to reduce the height of the step employing fluorocarbon chemistry.

15. The method according to claim 4, wherein:

the conductive features comprise metal features;

the second dielectric material comprises spin on glass or hydrogen silsesquioxane; and an upper surface of the second metal feature has an area no less than about 100 microns$^2$.

* * * * *